(12) United States Patent
Jeon et al.

(10) Patent No.: US 11,956,587 B2
(45) Date of Patent: Apr. 9, 2024

(54) PORTABLE ELECTRONIC DEVICE

(71) Applicant: LG ELECTRONICS INC., Seoul (KR)

(72) Inventors: Sangkuk Jeon, Seoul (KR); Kanghee Min, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 180 days.

(21) Appl. No.: 17/717,615

(22) Filed: Apr. 11, 2022

(65) Prior Publication Data

US 2023/0171530 A1 Jun. 1, 2023

(30) Foreign Application Priority Data

Dec. 1, 2021 (WO) ................ PCT/KR2021/095115

(51) Int. Cl.
*H04R 1/10* (2006.01)
*G06F 3/041* (2006.01)

(52) U.S. Cl.
CPC ........... *H04R 1/1041* (2013.01); *G06F 3/041* (2013.01); *H04R 1/1016* (2013.01); *H04R 2420/07* (2013.01)

(58) Field of Classification Search
CPC .................................................... H04R 1/1041
See application file for complete search history.

(56) References Cited

U.S. PATENT DOCUMENTS

| | | | |
|---|---|---|---|
| 2020/0100013 | A1 | 3/2020 | Harjee et al. |
| 2020/0169804 | A1 | 5/2020 | Lin et al. |
| 2020/0201439 | A1 | 6/2020 | Wong et al. |

FOREIGN PATENT DOCUMENTS

| | | |
|---|---|---|
| CA | 930311 | 7/1973 |
| CN | 112578461 | 3/2021 |
| CN | 212785783 | 3/2021 |
| DE | 102013021575 | 6/2015 |
| FR | 2078851 | 11/1971 |
| KR | 10-2015-0081496 | 7/2015 |
| KR | 10-2019-0032124 | 3/2019 |
| KR | 10-2021-0035246 | 3/2021 |
| WO | 2018108475 | 6/2018 |

(Continued)

OTHER PUBLICATIONS

European Patent Office Application Serial No. 22168452.5, Search Report dated Jan. 5, 2023, 15 pages.

(Continued)

*Primary Examiner* — Mark Fischer
(74) *Attorney, Agent, or Firm* — LEE, HONG, DEGERMAN, KANG & WAIMEY

(57) ABSTRACT

A portable electronic device includes a housing, a user input unit configured to detect touch input and push input, and a carrier, on which the user input unit is seated and which is inserted into the housing, wherein the user input unit includes a first input unit, closely disposed on an inner surface of the housing so as to detect touch input, and a second input unit, disposed inside the first input unit in the state of overlapping the first input unit so as to detect push input, the second input unit including a metal spring that changes in shape in response to the push input. The portable electronic device is capable of detecting two types of input and thus of ensuring that is possible to input a sufficient number of user instructions.

15 Claims, 14 Drawing Sheets

(56) References Cited

FOREIGN PATENT DOCUMENTS

WO    2021-081570    4/2021

OTHER PUBLICATIONS

PCT International Application No. PCT/KR2021/095115, Written Opinion and International Search Report dated Aug. 18, 2022, 10 pages.
European Patent Office Application Serial No. 22168452.5, Partial Search Report dated Oct. 17, 2022, 17 pages.

(a)

(b)

(a)            (b)

(a)

(b)

(c)

(d)

(a)

(b)

(a)

(b)  (c)

(a)

(b)

(c)

(a)

(b)

(c)

(a)

(b)

(c)

(a)

(b)

(c)

(d)

PORTABLE ELECTRONIC DEVICE

CROSS-REFERENCE TO RELATED APPLICATIONS

Pursuant to 35 U.S.C. § 119, this application claims the benefit of an earlier filing date and right of priority to International Application No. PCT/KR2021/095115, filed on Dec. 1, 2021, the contents of which are hereby incorporated by reference herein in its entirety.

BACKGROUND

Field

The present disclosure relates to a portable electronic device including a user input unit.

Discussion of the Related Art

"Portable sound device" refers to a sound device configured to receive a sound signal from a terminal device and to transmit sound information collected through a microphone to the terminal device. Conventionally, portable sound devices have adopted wired communication technology in which a terminal of a portable sound device is inserted into an ear port of a terminal device so as to receive sound signals. Recently, demand for wireless-communication-type portable sound devices is increasing due to convenience in mobility and use thereof.

A portable sound device may be provided with a sound output unit in order to fulfill various functions, including those of music reproduction, telecommunications, and the like. Such a portable sound device is capable of being connected to a base station by itself for telecommunications or of being directly connected to an external server so as to receive sound data. In addition, such a portable sound device is capable of fulfilling the above functions by being paired with another terminal device.

Portable sound devices, including a headphone-type portable sound device configured to have a band shape so as to be worn on a user's head, an ear-hook-type portable sound device, and an ear-fit-type portable sound device, which are designed in consideration of portability, have been developed.

Because portable sound devices, which are designed to be worn on a user's head or to be hung on a user's neck, have a somewhat large volume, demand for an earbud-type portable sound device, which is constructed such that only earbuds, which are put into a user's ears, are configured so as to be operated wirelessly, and a cradle serving as a case capable of charging the earbuds and or storing the earbuds therein is additionally provided, is recently increasing. Although the earbud-type portable sound device is convenient to use, there is a difficulty in disposition of parts such as a battery, a user input unit, and the like because the portable sound device is small.

SUMMARY

An object of the present disclosure is to provide a portable electronic device including a user input unit capable of detecting two types of input.

In order to accomplish the above object, an aspect of the present disclosure provides a portable electronic device including a housing, and a user input unit disposed in the housing, wherein the user input unit includes a first input unit, closely disposed on the inner surface of the housing so as to detect touch input, and a second input unit disposed inside the first input unit in the state of overlapping the first input unit so as to detect push input.

The user input unit may include a flexible board on which the first input unit and the second input unit are mounted, and a connector connecting a main board mounted on the housing to the first input unit and the second input unit.

The flexible board may include a first board on one surface of which the first input unit is mounted and on another surface of which the second input unit is mounted, and one surface of the first board may be closely disposed on the inner surface of the housing.

The first board may include a first insulation layer positioned on one surface thereof, the first input unit being disposed at the first insulation layer, a second insulation layer positioned on another surface thereof, the second input unit being disposed at the second insulation layer, and a ground layer positioned between the first insulation layer and the second insulation layer.

The portable electronic device may further include a carrier, on which the user input unit is seated and which is inserted into the housing, and a metal spring covering the second input unit and spaced apart from the another surface of the first board by a predetermined distance, and the metal spring may be in contact with the carrier.

The push input may be determined based on variation in the distance between the second input unit and the metal spring.

The portable electronic device may include a dielectric body that has elasticity and is disposed between the second input unit and the metal spring.

The second input unit may include the first electrode and a second electrode disposed on the another surface of the first board and spaced apart from each other, the metal spring may be grounded, and variation in a distance between the first and second electrodes and the metal spring may be detected based on variation in the intensity of an electrical field between the first electrode and the second electrode.

The second input unit may include the first electrode positioned on the another surface of the first board, and a second electrode positioned on the another surface of the first board and connected to the metal spring, and variation in a distance between the first and second electrodes and the metal spring may be detected based on variation in the intensity of an electrical field between the first electrode and the metal spring.

The flexible board may include a second board, disposed so as to face the another surface of the first board, and a third board, connecting the first board to the second board, the second input unit may include a first electrode positioned on the another surface of the first board and a second electrode disposed at the second board so as to face the first electrode, and the push input may be detected based on variation in a distance between the first electrode and the second electrode.

The portable electronic device may include a dielectric body that has elasticity and is positioned between the first board and the second board.

The portable electronic device may include a conductive pad, disposed on the another surface of the first board adjacent to the first electrode, and a controller, configured to periodically and alternately activate the first input unit and the second input unit and configured to periodically control potentials of the first electrode and the conductive pad to be the same upon activation of the first input unit.

The housing may include a main body, on which a sound output unit is mounted, and an extension coupled at one end thereof to the main body, the user input unit being mounted on the extension.

The first input unit may include a plurality of electrodes disposed on the extension in a longitudinal direction of the extension.

The additional scope within which the present disclosure is applicable will be apparent from the following detailed description. However, since various alternatives, modifications, equivalents and other embodiments that are included within the spirit and scope of the present disclosure will be appreciated by those skilled in the art, the detailed description and specific embodiments, such as preferred embodiments of the present disclosure, should be construed as merely illustrative.

DETAILED DESCRIPTION

A description will now be given in detail according to the exemplary embodiments disclosed herein, with reference to the accompanying drawings. For the sake of brevity of description with reference to the drawings, the same or equivalent components may be denoted by the same reference numbers, and a description thereof will not be repeated. In general, suffixes such as "module" and "unit", when are used in the following description, may be used to refer to elements or components for easy preparation of the specification. The use of such suffixes herein is merely intended to facilitate the description of the specification, and the suffixes do not imply any special meaning or function. Furthermore, in the following description of embodiments disclosed herein, if it is decided that a detailed description of known functions or configurations related to the invention would make the subject matter of the invention unclear, such detailed description is omitted. The accompanying drawings are used to assist in easy understanding of various technical features, and it should be understood that the embodiments presented herein are not limited by the accompanying drawings. As such, the present disclosure should be construed to extend to any alterations, equivalents, and substitutes, in addition to those which are particularly set out in the accompanying drawings.

It will be understood that although the terms "first", "second", etc. may be used herein to describe various elements, these elements should not be construed as being limited by these terms. These terms are only used to distinguish one element from another.

It should be understood that, when an element is referred to as being "connected with" another element, there may be intervening elements present, or the element may be directly connected with the another element. In contrast, it should be understood that, when an element is referred to as being "directly connected with" another element, there are no intervening elements present.

A singular representation may include a plural representation unless the context clearly indicates otherwise.

Terms such as "includes" or "has" used herein should be considered as indicating the presence of various features, numbers, steps, operations, elements, components or combinations thereof disclosed in the specification, but it should be understood that the presence or addition of one or more other features, numbers, steps, operations, elements, components or combinations thereof is not excluded.

Figure 1:
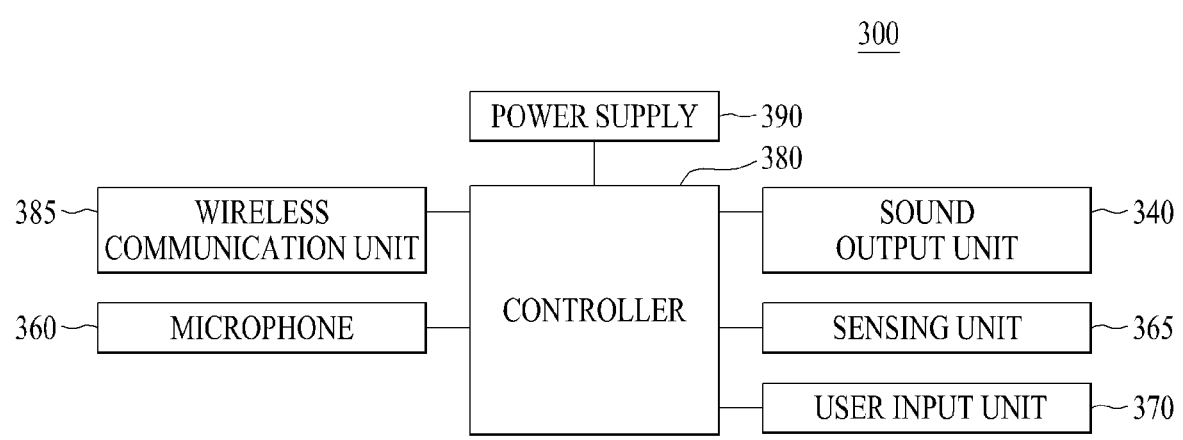
FIG. 1 is a block diagram illustrating the configuration of the portable sound device according to the present disclosure.
Figure 2:
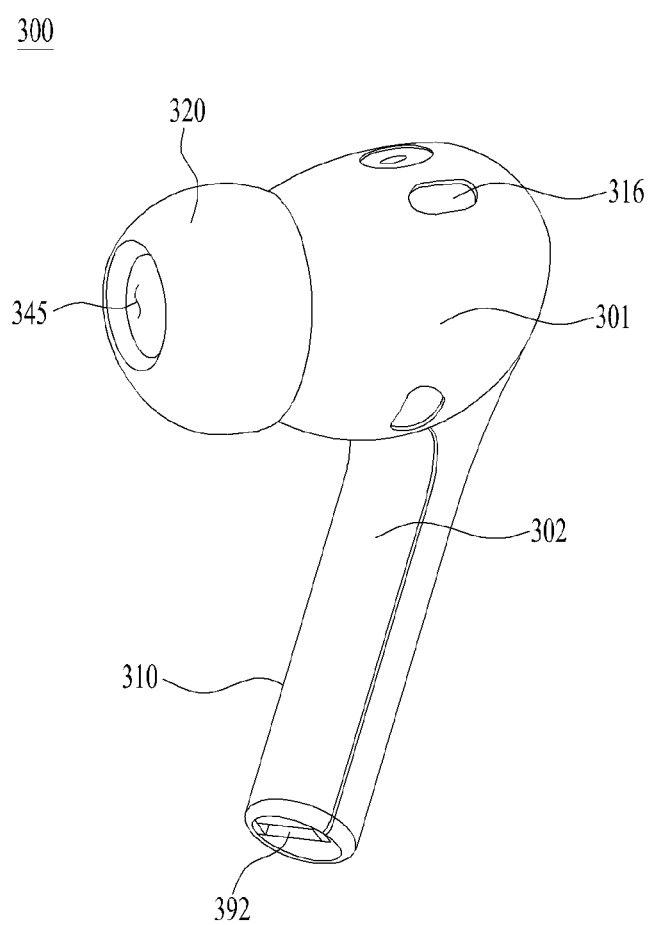
FIG. 2 is a perspective view illustrating the configuration of the portable sound device according to the present disclosure.

FIG. 1 is a block diagram of a portable sound device 300 according to an embodiment of the present disclosure. FIG. 2 is a perspective view illustrating the portable sound device 300 according to an embodiment of the present disclosure.

The portable sound device 300 according to the present disclosure may include a controller 380, a wireless communication unit 385, a sound output unit 340, a sensing unit 365, a microphone 360, a user input unit 370, and a power supply 390, and may be received in a housing 310.

As illustrated in FIG. 2, the housing 310 may include a main body 301, on which parts such as a sound output unit are mounted, and an extension 302 which extends from the main body 301 so as to be exposed to the outside of a user's ear. The extension 302 may be exposed to the outside, and may be provided therein with the input unit 370, the microphone 360, and the wireless communication unit 385.

The controller 380 may control the sound output unit 340 to be activated in response to a sound signal received through the wireless communication unit 385, and may control the sound output unit 340 to transmit the sound collected through the microphone 360 through the wireless communication unit 385 or to provide more clear sound by removing the noise from the sound collected through the microphone 360.

In the controller 380, a printed circuit board may be positioned in a housing 301. Because a plurality of ICs are mounted on the printed circuit board 381, there is a problem in that the thickness thereof is increased when the printed circuit board 381 is disposed so as to overlap a battery. Accordingly, a flexible circuit board may be used in order to dispose the printed circuit board so as not to overlap the battery and to realize mounting and connection of some components, such as the microphone 360, the user input unit 370, and the sound output unit 340.

The portable sound device according to the present disclosure may include the wireless communication unit 385 configured to receive sound signals via wireless communication. Although the wireless communication unit 385 may itself be connected to a mobile communication base station to perform communication, the wireless communication unit 385 may generally be connected to an external device such as a mobile terminal through short-range communication.

Examples of the short-range communication may include at least one of Bluetooth™, RFID (Radio Frequency Identification), Infrared Data Association (IrDA), Ultra-Wideband (UWB), ZigBee, Nearfield Communication (NFC), Wi-Fi (Wireless-Fidelity), Wi-Fi Direct, and Wireless USB (Wireless Universal Serial Bus).

The sound output unit 340, which is a device configured to output sound according to a sound signal, may be put into a user's ear so as to serve to transmit sound. The sound output unit 340 may output sound based on the sound signals received through the wireless communication unit 385, and the housing 310 may be provided therein with a sound hole 345 through which the sound output from the sound output unit 340 is output.

The portable sound device according to the present disclosure may be of an earbud type, in which the sound output from the sound output unit 340 is directly transmitted to the ear canal of a user, and may include an ear tip surrounding the periphery of the sound hole 345 in order to improve wearing comfort and to block external noises.

The sound output unit 340 may further include a resonance hole 316 for resonance, in addition to the sound hole 345 through which sound is output. Here, the perceived sound may change depending on the position and size of the resonance hole 316.

The sensing unit 365 may detect conditions inside and outside the portable sound device, and may use the result of detection in control of the portable sound device. The sensing unit 140 may include at least one of a proximity sensor 141, an illumination sensor 142, a touch sensor, a motion sensor, an RGB sensor, an infrared (IR) sensor, an optical sensor, a battery gauge, or an environmental sensor (for example, a barometer, a hygrometer, a thermometer, a radioactive sensor, a heat detector, a gas detector, or the like).

However, because the size of the portable sound device 300 is limited, the number of sensing units 365 may be minimized, and ambient information (temperature, illuminance, and the like) may be obtained through a terminal connected via the wireless communication unit 385.

The microphone 360 may process an external sound signal into electric voice data. The processed voice data may be transmitted to an external terminal device or an external server through the wireless communication unit 385. The microphone 360 may realize various denoising algorithm for removing noise generated in the course of receiving external sound signals.

Such noise removal technology is referred to as active noise control (ANC), noise canceling, or active noise reduction (ANR). ANC is technology for blocking noise by analyzing noise collected through a microphone and outputting an interference signal capable of cancelling the noise.

The power supply 390 may include a battery, which is mounted in the portable sound device in order to supply power required to operate the device in a wireless manner. Because the battery must be disposed in a small space and convenience in use is deteriorated when the battery is too heavy, an additional cradle may be provided in order to store and charge the battery.

When the portable sound device is inserted into the cradle, the battery disposed in the housing may be charged using an auxiliary battery provided in the cradle. For connection to the auxiliary battery in the cradle, a charging terminal 392 may be exposed to the outside of the housing 310.

The user input unit 370 is a unit for inputting a user command. Although it is possible to obtain information through a mobile terminal connected to the wireless communication unit 385, the simple user input unit 370 may be provided so as to allow simple manipulation to be performed without a mobile terminal.

For example, there is need for an input unit capable of allowing a user to select playback/pause of sound, to determine whether or not a call signal is received upon transmission of the call signal, and to control the volume of sound. Here, a button-type user input unit, which is capable of being pushed, is necessary in the case of simple function conversion, and a slide-type user input unit, which is capable of detecting input in a slide manner, is necessary when there is a need for stepwise control such as volume control.

Because the user input unit 370 must be exposed to the outside, the user input unit 370 may be positioned at the side opposite the sound hole 345 in the device body or at the extension 302. The present disclosure is directed to a user input unit positioned at the extension 302. Hereinafter, the user input unit will be described in detail with reference to the accompanying drawings.

The user input unit 370, which will be described hereinafter, may be applied not only to a sound device including the sound output unit 340 but also to other small-sized portable electronic devices. For convenience of explanation, the user input unit is described based on an electronic device including the sound output unit.

The user input unit 370 according to the embodiment may include a first input unit 371 configured to detect touch input and a second input unit 372 configured to detect push input. The first input unit 371 may include a plurality of electrodes for detecting touch input in order to detect slide input in the direction in which the electrodes are arranged. When a user's finger moves in a longitudinal direction while touching the extension 302, it is possible to detect slide input and to perform stepwise control of, for example, volume.

The second input unit 372 configured to detect push input may include a force sensor, which has a small size and is capable of detecting push input.

The first input unit 371 is capable of detecting touch input in such a manner as to detect variation in the potential of the electrode due to a user's finger when the user's finger comes into contact with the electrode, and is capable of detecting slide input in such a manner as to detect electrodes with which a user's finger sequentially comes into contact.

The second input unit 372 may include a force sensor. The force sensor may use a strain gauge, an MEMS (MicroElectroMechanical Systems) ultrasonic sensor, an inductive sensor including a coil, an electrode sensor, or the like.

The strain gauge may detect push input in such a manner as to detect variation in the resistance of a resistance wire, which is disposed in a zigzag pattern, caused when the length of the resistance wire is changed due to pressure. In order to detect the direction of pressure, a plurality of strain gauges may be used. In order to detect only whether or not strain is present, the second input unit 372 may be embodied as a single strain gauge.

The MEMS ultrasonic sensor, which is an ultrasonic sensor capable of recognizing the three-dimensional shape of an object in air by combining a thermally-induced ultrasonic source that uses the thermal properties of nanocrystal porous silicon with a MEMS-type condenser microphone, is capable of detecting strain.

The inductive sensor including a coil, which includes a coil and a metal object, is capable of detecting push input by detecting variation in current flowing through the coil caused when the distance between the coil and the adjacent metal object is changed upon application of pressure by a user.

The electrode sensor, which is a force sensor including two electrodes, which are spaced apart from each other with a predetermined gap therebetween, is capable of detecting push input by detecting variation in the intensity of an electrical field formed between the two electrodes that occurs when pressure is applied to the force sensor.

Although the following embodiment will be described based on an electrode sensor, the user input unit 370 may also be embodied as another type of force sensor.

Figure 3:
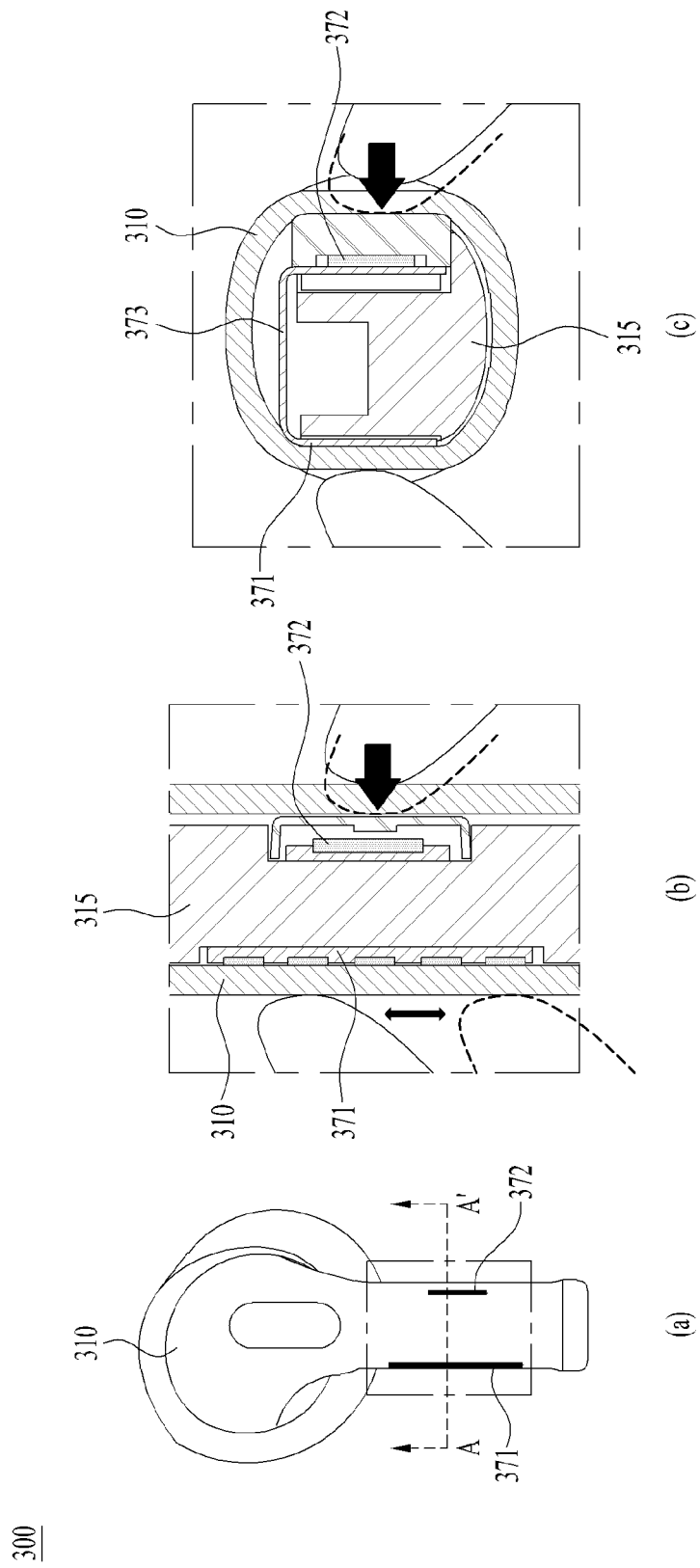
FIG. 3 is a view illustrating the disposition of a user input unit of the portable sound device according to an embodiment of the present invention.

FIG. 3 is a view illustrating disposition of the user input unit 370 of the portable sound device 300 according to an embodiment of the present disclosure. Referring to FIG. 3(a), the user input unit 370 may be positioned at the extension 302, and the first input unit 371 and the second input unit 372 may be positioned opposite each other.

FIG. 3(b) is a cross-sectional view of the dotted square portion in FIG. 3(a). The first input unit 371, which is positioned at one side of the sound device, may detect slide input through the plurality of electrodes each configured to detect touch input of a user, and the second input unit 372, which is positioned at the opposite side of the sound device, may detect push input.

FIG. 3(c) is a cross-sectional view taken along line A-A' in FIG. 3(a). The first input unit 371 may be closely disposed on the inner surface of the housing 310, and the second input unit 372 may be disposed in the state of being spaced apart from the housing 310 so as to detect push input by detecting variation in the distance between the second input unit 372 and the housing 310.

Although the extension 302 is illustrated as having a cylindrical form, the extension 302 may have a flat surface so as to realize a constant distance between the first input unit 371 and the housing 310. The second input unit 372 may also have a flat surface so as to allow a user to recognize the position of the second input unit 372 using his/her sense of touch.

Figure 4:
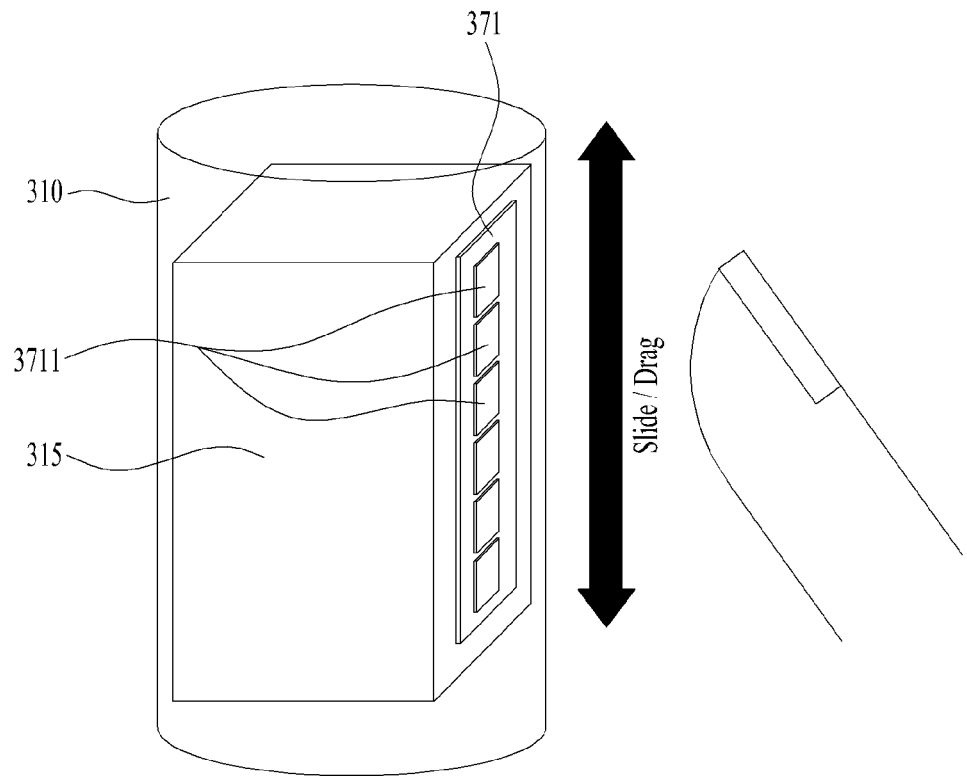
FIG. 4 is a conceptual view illustrating a first input unit and a second input unit of the portable sound device according to the present disclosure.
Figure 4:
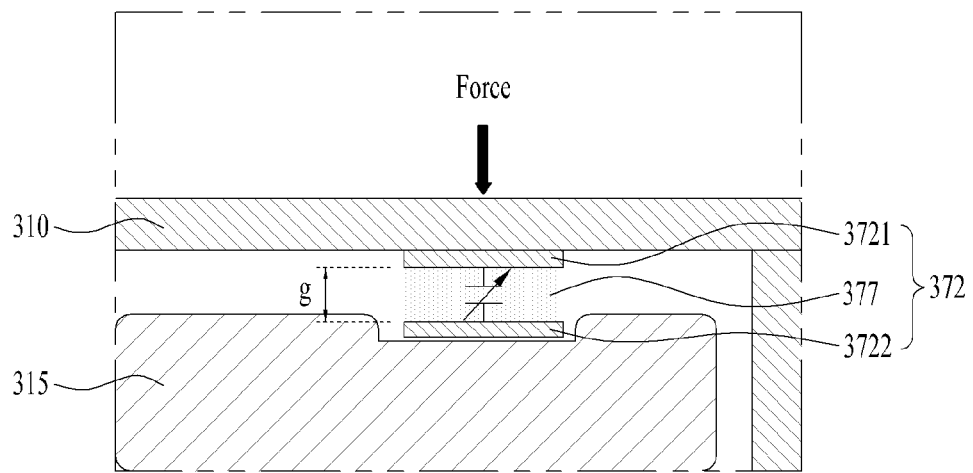

FIG. 4 is a conceptual view illustrating the first input unit 371 and the second input unit 372 of the portable sound device 300 according to the present disclosure. FIG. 4(a) illustrates the first input unit 371, and FIG. 4(b) illustrates the second input unit 372.

As illustrated in FIG. 4(a), the first input unit 371 includes a plurality of electrodes 3711, which are sequentially arranged in one direction. When a user touches one of the plurality of electrodes 3711, the resistance of the electrode is changed, whereby the first input unit 371 detects the touch input. When sequential touch inputs on the plurality of electrodes 3711 are detected, the first input unit 371 may recognize the sequential touch inputs as slide touch input, and consequently perform a function such as volume control or the like.

The first input unit 371 may be closely disposed on the inner surface of the housing 310 such that the distance between the electrode and a user's finger is constant when the user touches the housing 310.

As illustrated in FIG. 4(b), the second input unit 372 may include a pair of electrodes 3721 and 3722. The first electrode 3721 and the second electrode 3722 may be disposed with a predetermined gap defined therebetween so as to detect variation in the distance between the pair of electrodes.

The first electrode 3721 may be in close contact with the inner surface of the housing 310, and the second electrode 3722 may be positioned on a carrier 315 positioned inside the housing 310. When a user presses the housing 310, variation in an electrical field between the first electrode 3721 and the second electrode 3722 and consequent variation in electrostatic capacitance occur due to minute displacement of the housing 310. The controller may detect whether or not user input is applied based on the variation in electrostatic capacitance between the first electrode 3721 and the second electrode 3722.

Figure 5:
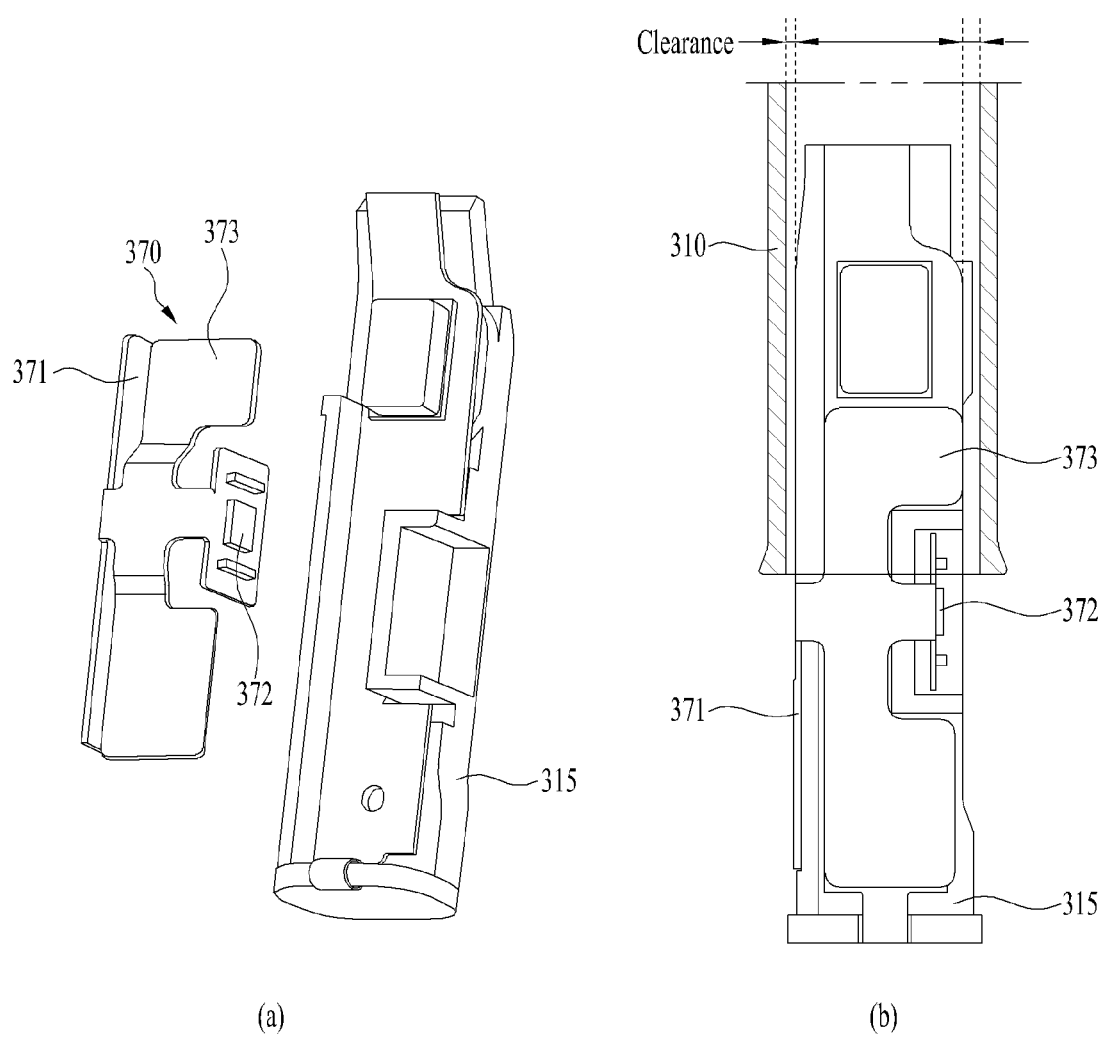
FIG. 5 is a view illustrating a process of assembling the user input unit of the portable sound device according to an embodiment of the present disclosure.

FIG. 5 is a view illustrating a process of assembling the user input unit 370 of the portable sound device 300 according to an embodiment of the present invention. The user input unit 370 may be formed on a single flexible board 373. The flexible board 373 may include a first board 3731 at which the first input unit 371 is positioned and a second board 3732 at which the second input unit 372 is positioned. The first board 3731 and the second board 3732 may be positioned opposite each other.

The portable sound device 300 may include a carrier 315 on which the user input unit 370 is seated and at which a battery, a microphone, an antenna, and the like are disposed. As illustrated in FIG. 5(b), the carrier 315 may be inserted into the lower portion of the cylindrical form corresponding to the extension 302.

In order to prevent the carrier 315 from catching on the inner surface of the housing 310 and thus from becoming difficult to insert into the housing 310 when the carrier 315 is inserted into the housing 310 or in order to prevent the user input unit 370 from breaking due to friction against the housing 310 when the user input unit 370 is assembled, there is a need to provide a clearance for erection tolerance between the housing 310 and the carrier 315.

When a space is provided between the housing 310 and the carrier 315 for erection tolerance, there may be the case in which the gap required for detection of pressure of the second input unit 372 is not stably maintained. Accordingly, an elastic member, which is deformed upon compression and is then restored to the original shape, may be used.

Figure 6:
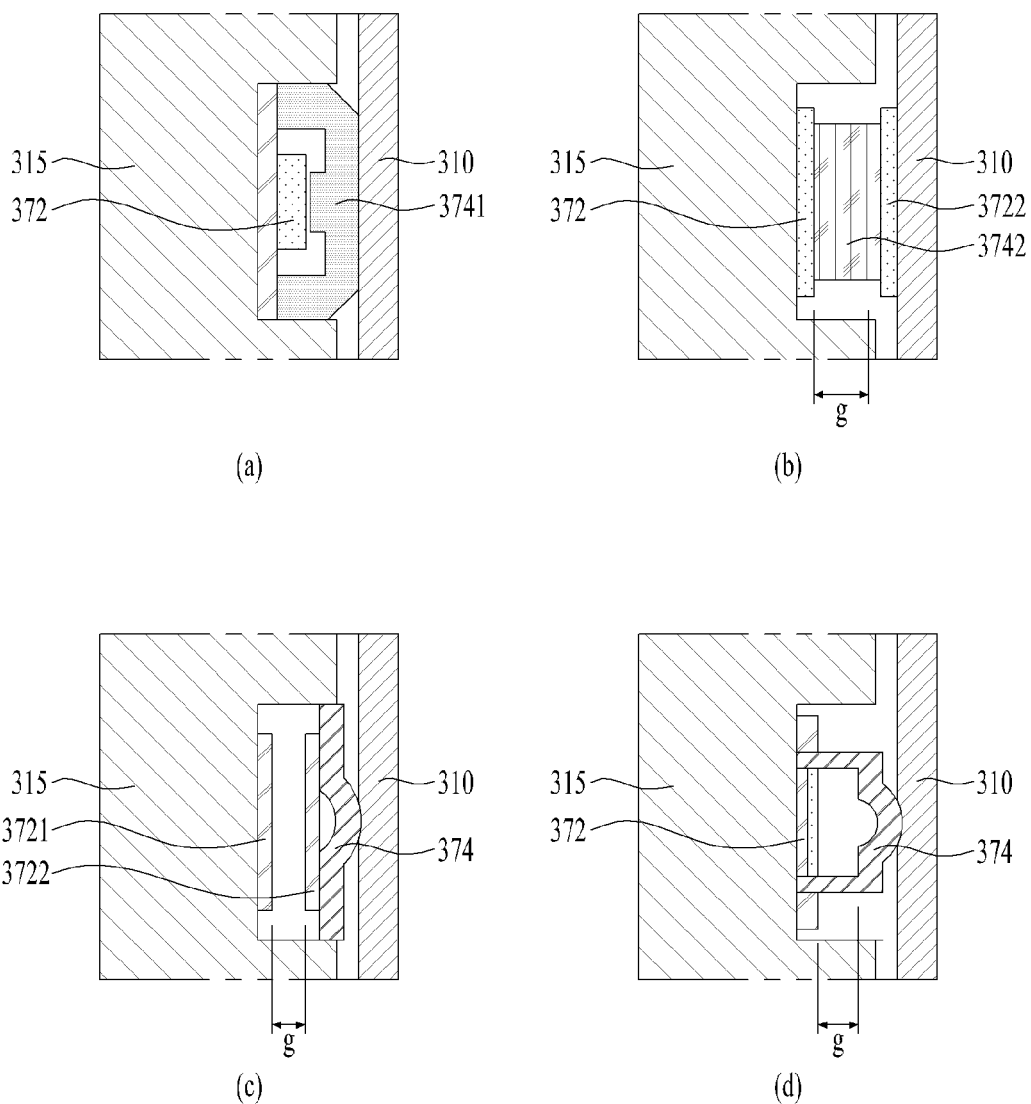
FIGS. 6 and 7 are views illustrating various embodiments of the first input unit of the portable sound device according to the present disclosure.
Figure 7:
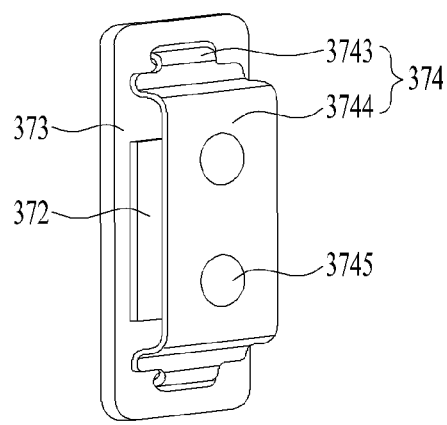
Figure 7:
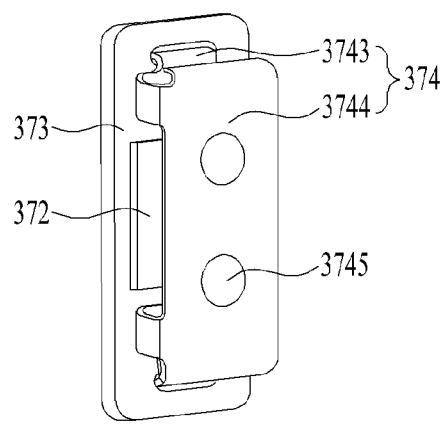
Figure 7:
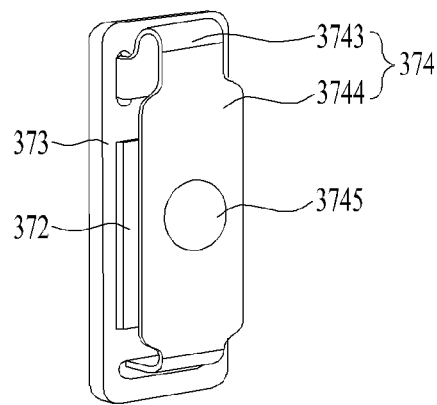
Figure 7:
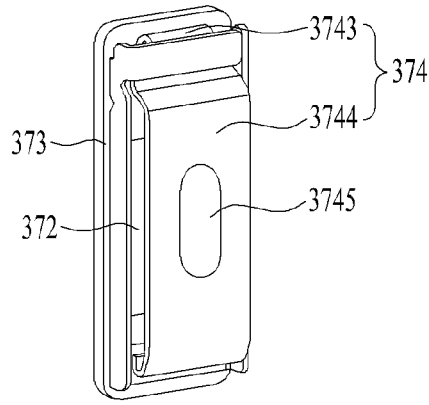

FIGS. 6 and 7 are views illustrating various embodiments of the first input unit 371 of the portable sound device 300 according to an embodiment of the present disclosure. As illustrated in FIG. 5(a), an elastic cap 3741, which is made of an elastic material such as rubber or silicone, may be provided between the housing 310 and the second input unit 372. The elastic cap 3741 may include an actuator, which projects to press the second input unit 372.

Alternatively, as illustrated in FIG. 6(b), a foam tape 3742, which includes elastic foam, may be provided so as to maintain a distance between the housing 310 and the second input unit 372. Specifically, the foam tape 3742 may be disposed between a pair of electrodes of the second input unit 372 so as to sense variation in the distance between the electrodes caused by application of pressure.

FIGS. 6(c) and 6(d) illustrate an embodiment in which a metal spring 374 is used as an elastic member. The metal spring 374 may be compressed when the carrier 315 is inserted into the housing 310, and may be restored to the original shape after assembly, thus maintaining the distance between the housing 310 and the second input unit 372. The metal spring 374 may be compressed when pressure is applied to the second input unit 372 by a user, and may be restored to the original shape after release of the application of the pressure.

FIG. 6(c) illustrates an embodiment in which electrodes forming a pair are respectively positioned at the metal spring 374 and the carrier 315. FIG. 6(d) illustrates an embodiment in which the metal spring 374 is electrically connected to a board on which the second input unit 372 is mounted and the metal spring 374 itself serves as an electrode.

FIG. 7 illustrates various embodiments of the second input unit 372 including the metal spring 374 shown in FIGS. 6(c) and 6(d) in which the metal spring 374 is coupled to a flexible board 373 on which the second input unit 372 is mounted. The metal spring 374 may include a cover portion 3744 covering the second input unit 372 and a connection portion 3743 connected to the flexible board 373.

As illustrated in FIG. 7, the connection portion 3743 may be bent so as to be restored to the original shape even when the connection portion 3743 is deformed by pressure. The metal spring 374 may further include an actuator 3745 projecting therefrom. As illustrated in FIGS. 7(a) and 8(b), the metal spring 374 may include two actuators in order to embody two second input units 372.

In the case in which the portable sound device 300 has a small size, as in an earbud-type portable sound device, the portable sound device may include only a single second input unit 372, as illustrated in FIGS. 7(c) and 7(d).

Figure 8:
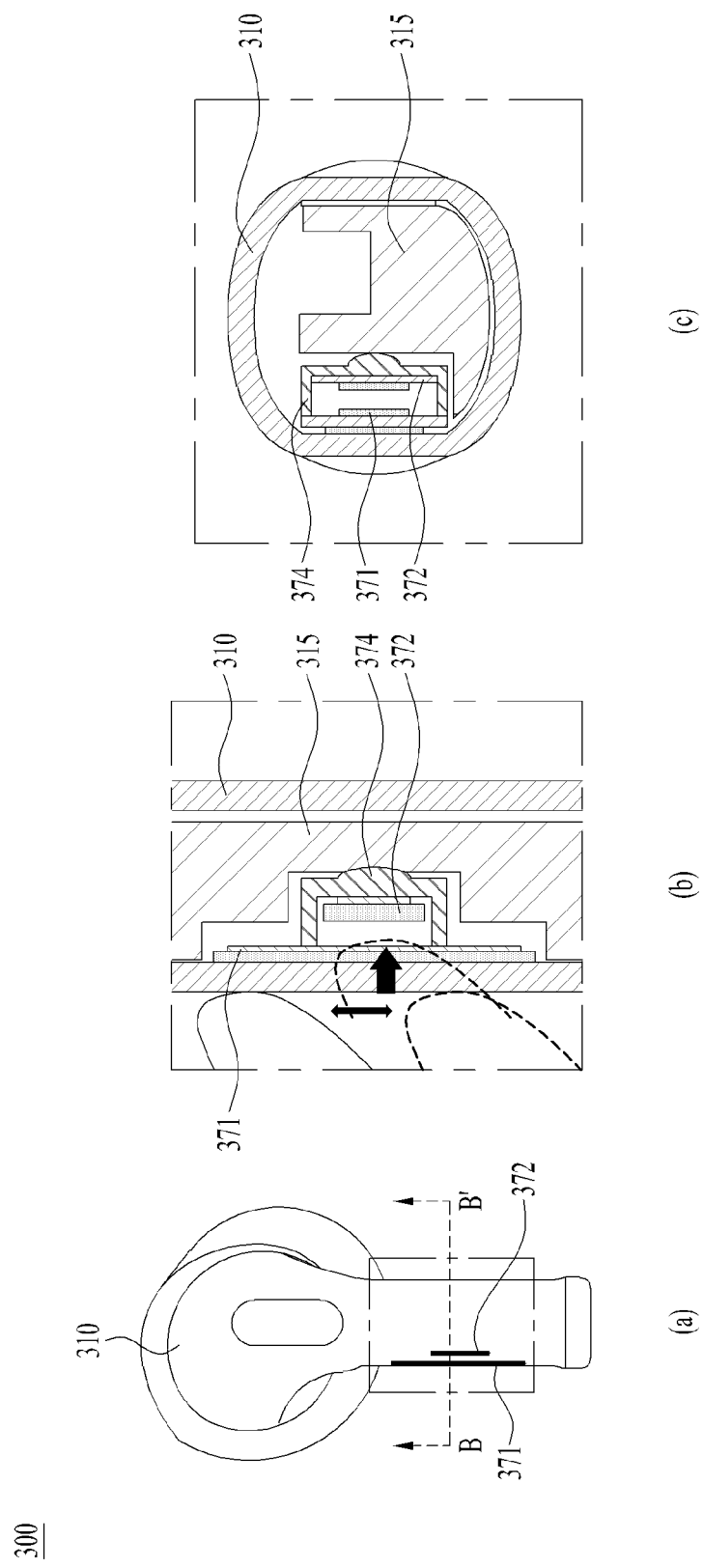
FIG. 8 is a view illustrating the disposition of the user input unit of the portable sound device according to another embodiment of the present disclosure.

FIG. 8 is a view illustrating the disposition of the user input unit 370 of the portable sound device 300 according to another embodiment of the present disclosure. As illustrated in FIG. 8(a), the user input unit 370 according to the embodiment may be configured such that the first input unit 371 and the second input unit 372 are positioned at the same side of the extension 302.

The previous embodiment has a problem in which the first input unit and the second input unit of the user input unit 370 are respectively disposed at two sides of the extension 302 and thus the proportion of the limited space occupied by the user input unit 370 increases, thereby causing the amount of space for accommodating other parts such as a battery and the like to be insufficient or requiring the size of the extension 302 to be increased.

Accordingly, the first input unit 371 and the second input unit 372 may be disposed at the same side of the extension 302 in order to reduce the size of the user input unit 370 to thus improve the amount of available space inside the extension 302, as illustrated in FIG. 8. As illustrated in FIG. 8(b), a user may provide input through the first input unit 371 by touching the side of the extension 302 in a slide touch manner, and may also provide push input through the second input unit 372 by pressing the side of the extension 302.

FIG. 8(c) is a cross-sectional view taken along line B-B' in FIG. 8(a). Here, the first input unit 371 may be closely disposed at the housing 310 and the second input unit 372 may be disposed inside the first input unit 371. The portable sound device may include an elastic member such as the metal spring 374 in order to provide a gap between the first input unit 371 and the second input unit 372.

Figure 9:
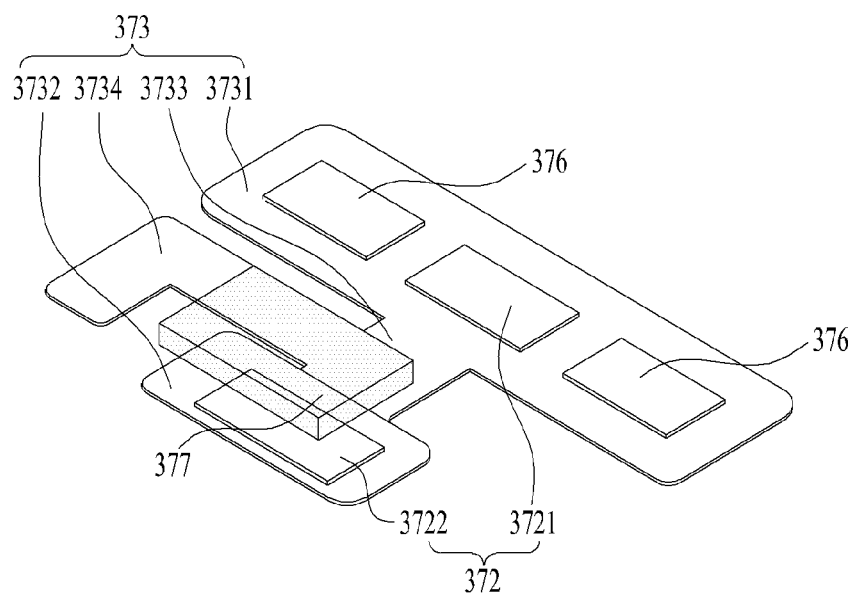
FIG. 9 is a view illustrating the user input unit of the portable sound device according to another embodiment of the present disclosure.
Figure 9:
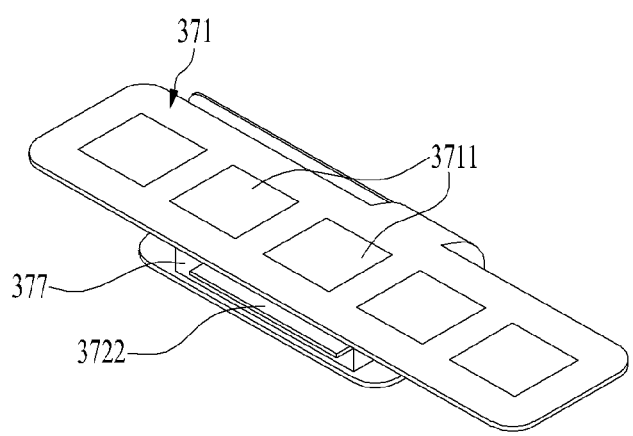

FIG. 9 is a conceptual view of the user input unit 370 shown in FIG. 8. The first input unit 371 may include a plurality of electrodes, which are positioned on one surface (the outer surface) thereof. The plurality of electrodes may be arranged in the longitudinal direction of the extension 302.

The second input unit 372 may be positioned inside the first input unit 371 so as to detect an electrical field, that is, the electric capacitance between two electrodes, which are spaced apart from each other by the other surface of the first input unit 371. As illustrated in FIG. 8(b), when a user presses the outer surface of the housing 310 of the extension 302, the distance between the pair of electrodes is decreased, thereby causing variation in the electric capacitance.

FIG. 9 is a conceptual view illustrating an embodiment of the user input unit 370, in which FIG. 9(a) illustrates the user input unit 370 which is unfolded and FIG. 9(b) illustrates the user input unit 370 which is folded so as to be mounted in the housing 310. As illustrated in FIG. 9(a), the user input unit 370 may be disposed on the flexible board 373, and the electrodes of the first input unit 371 and the second input unit 372 may be disposed on the surface of the flexible board 373.

Figure 12:
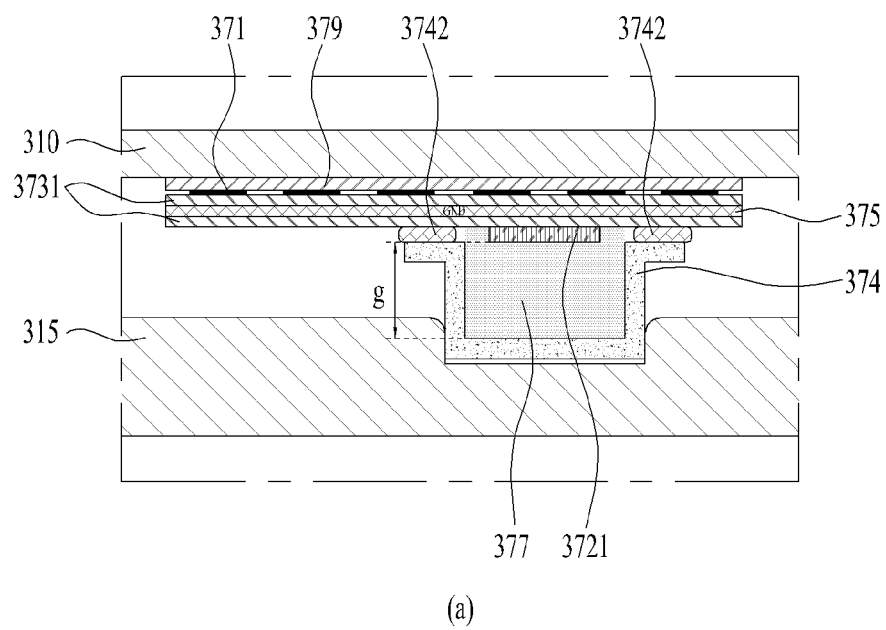
Figure 12:
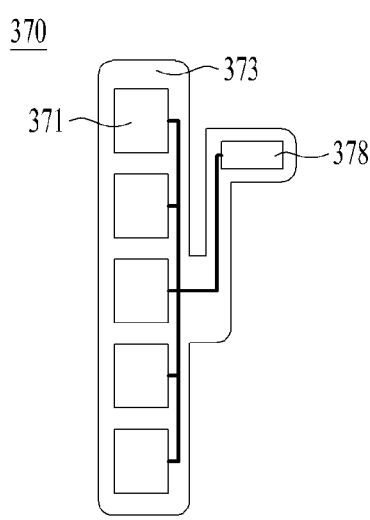
Figure 12:
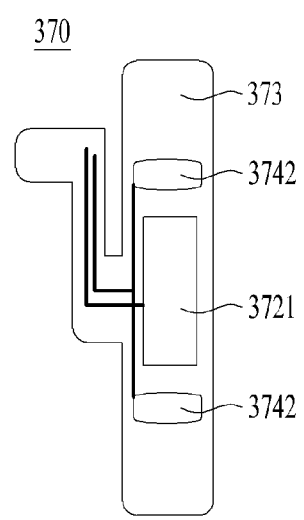
Figure 14:
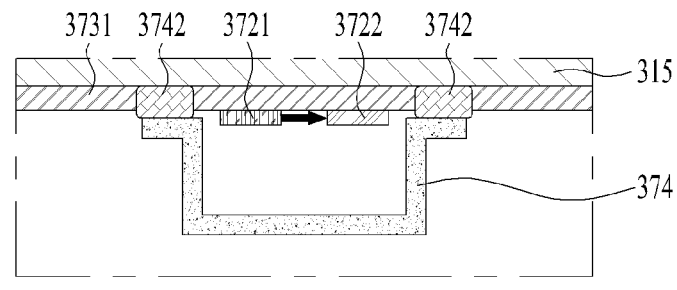
Figure 14:
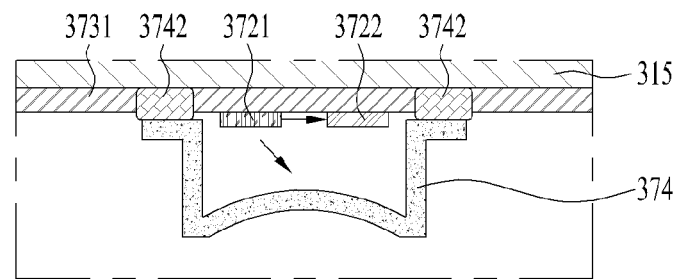
Figure 14:
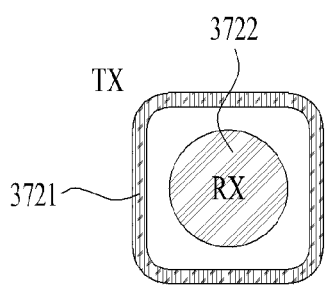
Figure 14:
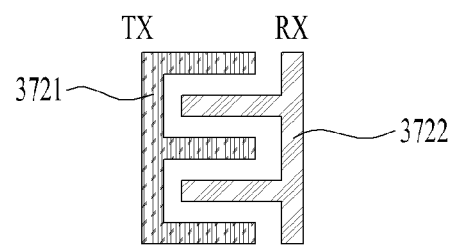

As illustrated in FIG. 9(b), the flexible board 373 may be folded such that the two parts thereof face each other, and may be mounted in the housing 310. Alternatively, as illustrated in FIGS. 12 and 14, the first input unit 371 and the second input unit 372 may be provided on a single flexible board 373.

The flexible board 373 may include the first board 3731, on one surface of which the plurality of electrodes are positioned and the second board 3732, which is disposed so as to face the other surface of the first board 3731. The second input unit 372 may include the first electrode 3721, which is positioned on the other surface of the first board 3731, and the second electrode 3722, which is positioned at the second board 3732 and faces the first electrode 3721 when the flexible board 373 is folded as illustrated in FIG. 9(b).

FIGS. 10 to 14 are views illustrating various modifications of the user input unit 370 of the portable sound device 300 according to another embodiment of the present disclosure, in each of which (a) illustrates a cross-section, (b) illustrates one surface of the flexible board 373 of the user input unit 370, and (c) illustrates the other surface of the flexible board 373.

Figure 10:
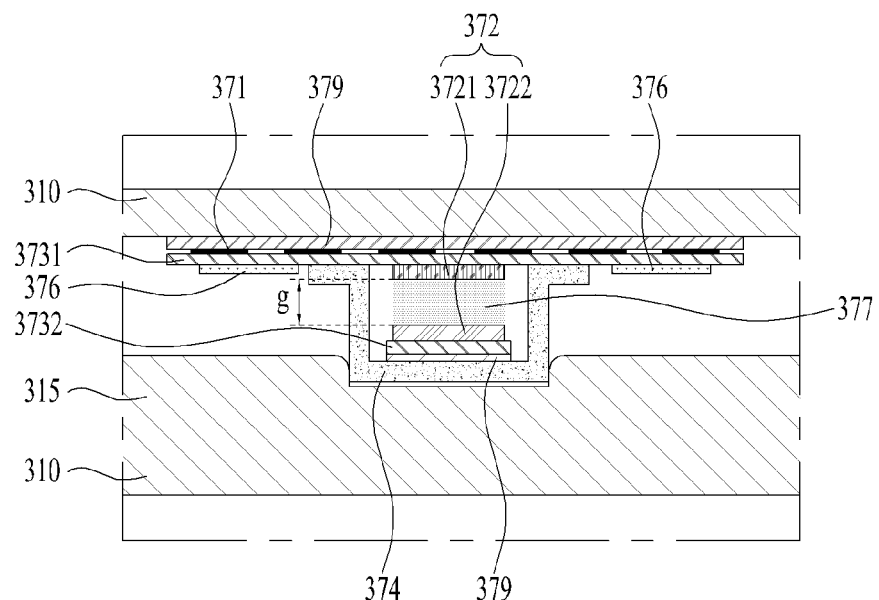
FIGS. 10 to 14 are views illustrating various modifications of the user input unit of the portable sound device according to another embodiment of the present disclosure.
Figure 10:
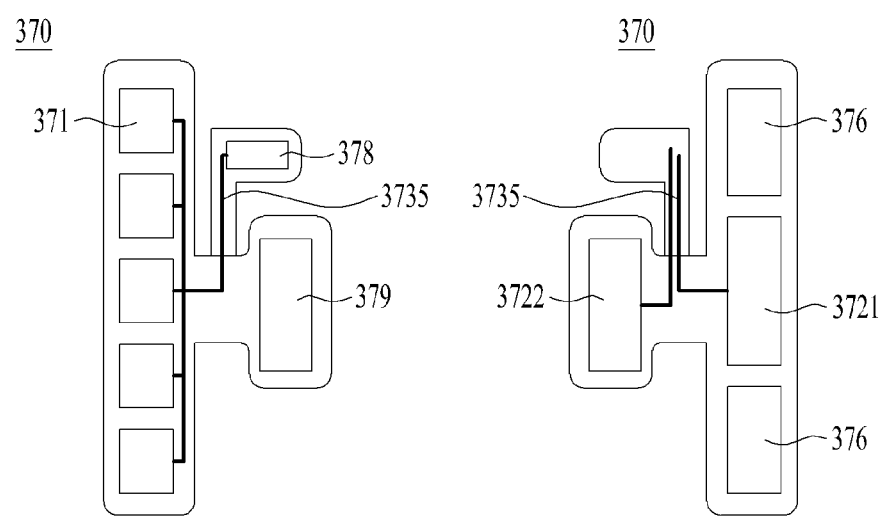

First, the flexible board 373 according to the embodiment shown in FIG. 10 may include the first board 373a and the second board 3732, which overlap each other, and the third board 3733, connecting the first board 3731 to the second board 3732.

The first board 3731 may be provided on one surface thereof with the plurality of electrodes of the first input unit 371, which are arranged in a line in the longitudinal direction of the extension 302. The second input unit 372 may include the first electrode 3721, which is positioned on the other surface of the first board 3731, and the second electrode 3722, which is formed on the second board 3732 so as to face the first electrode 3721.

In the state in which the flexible board 373 is unfolded, the electrodes of the first input unit 371 and a piece of adhesive tape 379 for attaching the second board 3732 to the carrier 315 may be positioned on one surface of the flexible board 373, as illustrated in (b) in each of the drawings, and the first electrode 3721 and the second electrode 3722 of the second input unit 372 may be positioned on the other surface of the flexible board 373, as illustrated in (c) in each of the drawings.

As illustrated in (a) of each of the drawings, the first input unit 371 may be closely coupled to the inner surface of the housing 310 via the piece of adhesive tape 379.

In order to maintain a gap g between the first electrode 3721 and the second electrode 3722, a dielectric body 377 having elasticity may be interposed therebetween. The dielectric body 377 may be made of a material that is easily deformed when pressed by a user.

As illustrated in FIG. 10(a), the metal spring 374, which is an elastic member, may be provided in order to restore the user input unit 370 to the original shape thereof after the pressure is released. The first board 3731 may be coupled to the housing 310, the second board 3732 may be coupled to the metal spring 374, and the metal spring 374 may be fixed to the first board 3731 coupled to the housing 310.

As illustrated in FIG. 10(b), a connector 378 may be provided in order to connect the first input unit 371 and the second input unit 372 to the controller. As illustrated in FIG. 10(b), the connector 378 may be positioned at the end of an additional fourth board extending from the user input unit 370. The flexible board 373 may include a circuit pattern 3735 connecting the first input unit 371 and the second input unit 372 to the connector 378.

Because this embodiment does not include an additional ground layer 375, there may be interference between the first input unit 371 and the second input unit 372, which are respectively positioned on the two surfaces of the first board 3731. Accordingly, it is possible to minimize the interference between the first input unit 371 and the second input unit 372 by alternately activating the first input unit 371 and the second input unit 372 at a predetermined cycle.

Particularly, as illustrated in FIG. 10(b), because the plurality of electrodes are arranged in the longitudinal direction of the extension 302 and some of the plurality of electrodes overlaps the second input unit 372 but others of the plurality of electrodes do not overlap the second input unit 372, there is a problem in that there is a difference between the electrodes of the first input unit 371.

Accordingly, it is possible to prevent the difference between the electrodes of the first input unit 371 by disposing conductive pads 376 at regions of the user input unit 370 at which the second input unit 372 is not present and controlling the potential of the second input unit 372 and the potential of the conductive pad 376 to be the same (for example, 0V) upon activation of the first input unit 371.

Figure 11:
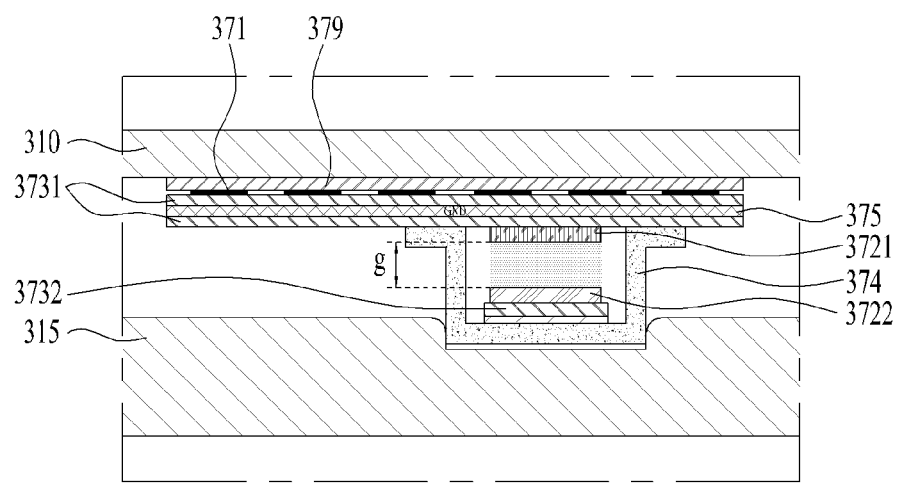
Figure 11:
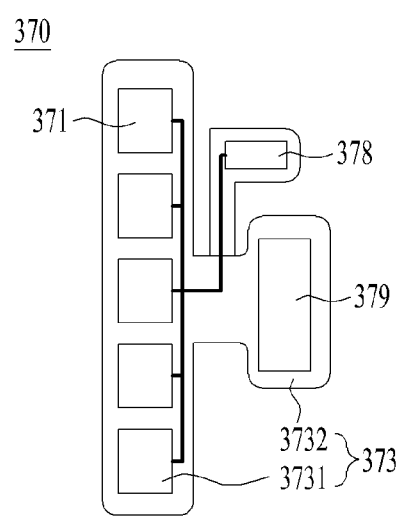
Figure 11:
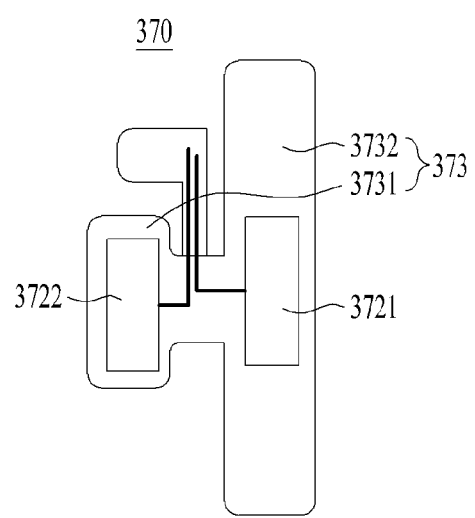

In order to eliminate interference between the first input unit 371 and the second input unit 372, the ground layer 375 may further be provided between the one surface and the other surface of the first board 3731, as illustrated in FIG. 11. Because the ground layer 375 is maintained at 0V, it is possible to isolate the first input unit 371 positioned on the one surface of the first board 3731 from the second input unit 372 positioned on the other surface of the first input unit 3731.

This embodiment is capable of simultaneously activating the first input unit 371 and the second input unit 372 without having to periodically and alternately activate the first input unit 371 and the second input unit 372, as in the previous embodiment.

The embodiment shown in FIG. 12 makes it possible to provide only the first electrode 3721 positioned on the other surface of the first board 3731, among the electrodes of the second input unit 372, and to obviate the second electrode 3722. In place of the second electrode 3722, the metal spring 374 may be electrically connected to the first board 3731 via soldering, thereby making it possible to use the metal spring 374 as the second electrode 3722.

Because the metal spring 374 is a conductive body including a metal material, it is possible to detect push input based on variation in the distance between the first electrode 3721 and the metal spring 374 by connecting the metal spring 374 to the second electrode 3722.

Because this embodiment is capable of omitting the second board 3732 of the user input unit 370, there is an advantage in that the structure is simplified. In addition, because the flexible board 373 is not disposed in the state of being bent, the efficiency of use of the internal space is improved.

Figure 13:
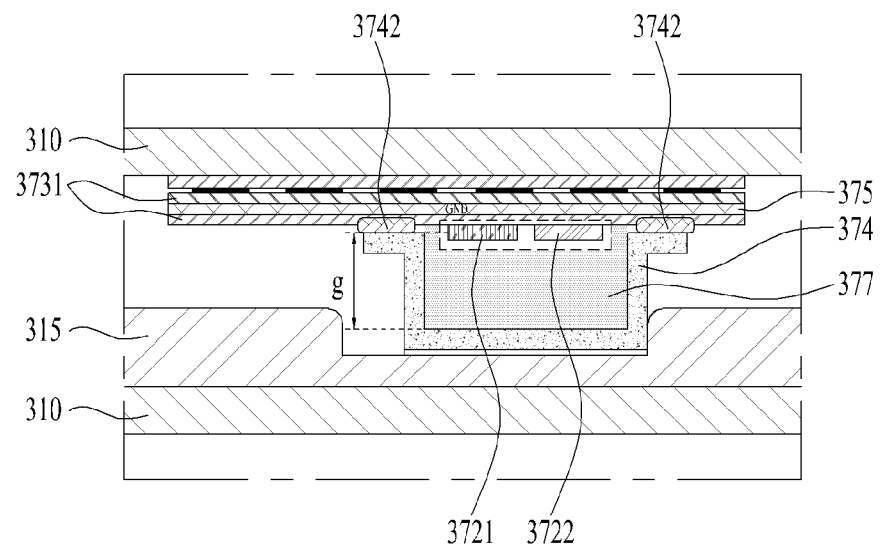
Figure 13:
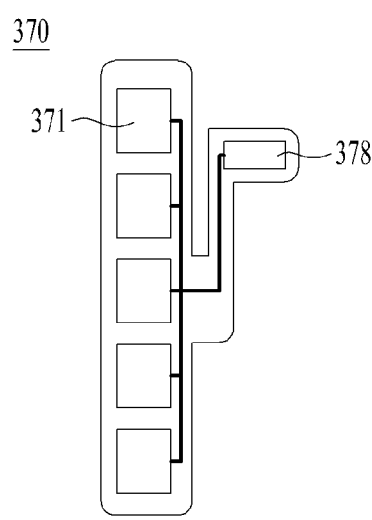
Figure 13:
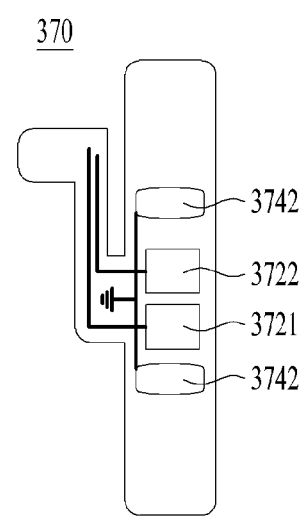

In the embodiment shown in FIG. 13, the second board 3732 may be omitted, like the previous embodiment, and all of the first electrode 3721 and the second electrode 3722 may be disposed on the other surface of the first board 3731.

The first electrode 3721 and the second electrode 3722 may be spaced apart from each other by a predetermined distance so as to form an electrical field therebetween. However, because both the first electrode 3721 and the second electrode 3722 are positioned at the first board 3731, variation in the electrostatic capacitance between the first electrode 3721 and the second electrode 3722 may not be very large, even when pressed by a user.

In order to increase variation in electrostatic capacitance between the first electrode 3721 and the second electrode 3722, the metal spring 374 may be connected to the first board 3731 so as to be connected to the ground layer 375.

FIG. 14 is a view illustrating the second input unit 372 in the embodiment shown in FIG. 13. Here, the shape of the metal spring 374 before being pressed, as shown in FIG. 14(a), may be changed when pressed, as shown in FIG. 14(b). When the distance between the metal spring 374 and the second input unit 372 is decreased, current may be directed toward the metal spring 374, thereby changing the electrical field between the first electrode 3731 and the second electrode 3722.

Accordingly, the variation in electrostatic capacitance between the first electrode 3721 and the second electrode 3722 may mean deformation of the metal spring 374, and the controller may detect that push input is applied. The first electrode 3721 and the second electrode 3722 may be square or circular pads, which are disposed adjacent to each other, and may be disposed in various fashions, as illustrated in FIGS. 14(c) and 14(d).

As is apparent from the foregoing description, since the portable sound device 300 according to the present disclosure is capable of detecting two kinds of input, it is possible to ensure a sufficient number of user instructions which are capable of being input.

In addition, the present disclosure is capable of providing a portable sound device 300 characterized by improved ease of assembly and stable performance by virtue of the improved structure thereof.

The above detailed description should be construed in all aspects as illustrative and not restrictive. The scope of the present disclosure should be determined by rational interpretation of the appended claims, and all of alternatives, modifications, equivalents, and other embodiments that are included within the equivalent scope of the present disclosure should be construed as falling within the spirit and scope of the present disclosure.

What is claimed is:

1. A portable electronic device comprising:
   a housing;
   a user input unit configured to detect touch input and push input; and
   a carrier, on which the user input unit is seated and which is inserted into the housing,
   wherein the user input unit comprises:
   a first input unit disposed on an inner surface of the housing in a manner so as to detect a touch input; and
   a second input unit disposed inside the first input unit in the state of overlapping the first input unit so as to detect a push input different from the touch input, the second input unit including a metal spring being changed in shape in response to the push input.

2. The portable electronic device according to claim 1, wherein the user input unit includes a first board having one surface where the first input unit is mounted and another surface where the second input unit is mounted, the one surface of the first board being disposed on the inner surface of the housing.

3. The portable electronic device according to claim 2, wherein the second input unit includes a first electrode positioned on the another surface of the first board, and
wherein the metal spring includes a cover portion covering the first electrode and a connection portion connected to the first board so as to cause the cover portion to be spaced apart from the first board.

4. The portable electronic device according to claim 3, wherein the first board comprises:
a first insulation layer positioned on the one surface of the first board, the first input unit being disposed in or on the first insulation layer;
a second insulation layer positioned on the another surface of the first board, the second input unit being disposed in or on the second insulation layer; and
a ground layer positioned between the first insulation layer and the second insulation layer.

5. The portable electronic device according to claim 4, wherein the metal spring is connected to the ground layer, and
wherein the push input is determined to have been applied when a variation in a distance between the first electrode and the metal spring is detected.

6. The portable electronic device according to claim 3, wherein the second input unit includes the first electrode and a second electrode disposed on the another surface of the first board, the first electrode and the second electrode being spaced apart from each other,
wherein the metal spring is grounded, and
wherein a variation in a distance between (a) the first and second electrodes and (b) the metal spring is detected based on a variation in an intensity of an electrical field between the first electrode and the second electrode.

7. The portable electronic device according to claim 3, wherein the second input unit includes:
the first electrode, positioned on the another surface of the first board, and
a second electrode, positioned on the another surface of the first board and connected to the metal spring, and
wherein variation in a distance between (a) the first and second electrodes and (b) the metal spring is detected based on a variation in an intensity of an electrical field between the first electrode and the metal spring.

8. The portable electronic device according to claim 3, wherein the user input unit further includes a second board disposed so as to face the another surface of the first board, and a third board, connecting the first board to the second board,
wherein the second input unit further includes a second electrode disposed in or on the second board so as to face the first electrode, and
wherein the push input is detected based on a variation in a distance between the first electrode and the second electrode.

9. The portable electronic device according to claim 8, further comprising a dielectric body having elasticity and positioned between the first board and the second board.

10. The portable electronic device according to claim 3, further comprising:
a conductive pad disposed on the another surface of the first board adjacent to the first electrode; and
a controller configured to:
periodically and alternately activate the first input unit and the second input unit, and
periodically control potentials of the first electrode and the conductive pad to be the same upon activation of the first input unit.

11. The portable electronic device according to claim 2, wherein the user input unit further includes a dielectric body having elasticity and positioned between the first board and the metal spring.

12. The portable electronic device according to claim 1, further comprising a connector connecting a main board mounted on the housing to the first input unit and the second input unit.

13. The portable electronic device according to claim 1, wherein the housing includes a main body, on which a sound output unit is mounted, and an extension having one end coupled to the main body, the user input unit being mounted on the extension.

14. The portable electronic device according to claim 13, wherein the first input unit includes a plurality of electrodes disposed on the extension in a longitudinal direction of the extension.

15. The portable electronic device according to claim 1, wherein the touch input comprises a slide touch input, and the second input unit includes a force sensor configured to detect the push input.

* * * * *